United States Patent [19]

Callaway, Jr. et al.

[11] Patent Number: 5,734,974
[45] Date of Patent: Mar. 31, 1998

[54] SELECTIVE CALL RECEIVERS WITH STEPWISE VARIABLE GAIN CONTROL

[75] Inventors: Edgar Herbert Callaway, Jr., Boca Raton; James Gregory Mittel, Lake Worth; Vance Howard Peterson, Boca Raton, all of Fla.; Burkhard Dick; Knud Holtvoeth, both of Hamburg, Germany; Wilfried Knop, Appen, Germany

[73] Assignee: Motorola, Inc., Schaumburg, Ill.

[21] Appl. No.: 625,435

[22] Filed: Mar. 27, 1996

[51] Int. Cl.$^6$ .................................................. H04B 1/06
[52] U.S. Cl. .................. 455/234.1; 330/282; 455/249.1
[58] Field of Search ........................ 455/234.1, 249.1, 455/250.1, 251.1; 330/282, 129, 86; 375/345

[56] References Cited

U.S. PATENT DOCUMENTS 5,036,527  7/1991  Halim et al. ................. 455/242.1 X
5,051,707  9/1991  Fujita ................................ 330/279

FOREIGN PATENT DOCUMENTS 2209444  5/1989  United Kingdom ................ 330/282

*Primary Examiner*—Thomas Mullen
*Attorney, Agent, or Firm*—Keith A. Chanroo

[57] ABSTRACT

A receiver (100) for receiving an input signal and generating an output signal therefrom has a switchable gain circuit (104) with a stepwise variable gain control (118), a local oscillator (106) and an automatic gain control (AGC) detector (114) with a response for detecting a level of the output signal and generating an AGC signal indicative of the level of the output signal and a state machine (116) being responsive to the AGC signal generating a control signal at the stepwise variable gain control to increase or decrease a gain of the switchable gain circuit in discrete stepwise steps.

10 Claims, 2 Drawing Sheets

SELECTIVE CALL RECEIVERS WITH STEPWISE VARIABLE GAIN CONTROL

FIELD OF THE INVENTION

This invention relates in general to receivers and more particularly to a method for improving performance of a selective call receiver by using an automatic gain control receiver having a stepwise switch.

BACKGROUND OF THE INVENTION

In order to operate in an increasingly crowded radio frequency (RF) environment and perform in the presence of strong interference signals, receivers with AGC (Automatic Gain Control) have become a necessity. Low intermediate frequency (IF) receivers, for example Zero-IF receivers, are greatly desired because of their lower cost and smaller size advantages, especially for portable subscriber units, e.g., selective call receivers. In addition to the usual stability design problems of AGC circuits of superheterodyne receivers well known to one of ordinary skill in the art, the requirements for designing an AGC receiver employing active selectivity, e.g. Zero-IF receivers, are much more stringent.

AGC receivers are preferably employed to produce a constant output level range for a predefined input level range. Generally, a disadvantage of AGC receivers is the requirement for a certain loop-time constant for stability. For a Zero-IF receiver, a time constant of nearly 300 ms is required for stability and to minimize AGC control voltage ripple caused by the low operation frequency of AGC detector, which may otherwise affect the receiver adjacent channel selectivity. This makes a fast warm-up time difficult to achieve, even with good transient startup (adapt) circuits. This is very undesirable for selective call receivers which require the receivers to be periodically turned on and off to conserve battery power.

Another big problem with AGC in Zero-IF receivers is self-reception. Self-reception is when the receiver receives its own local oscillator (LO) signal (e.g., $n*V_{LO}$) or any unmodulated on-channel signal which produces a (direct current) DC-voltage at the output of the receiver first mixer. Changes in the offset voltage caused by changes in the self-reception signal propagate through the receiver circuit and are detected as transients by the AGC. These transients affect the stability of the AGC loop.

Thus, what is needed is a method for lowering the start-up time of AGC receivers for use in selective call receivers and to control the response of AGC receivers to changes in signal strength to reduce effects from interference caused by self-reception.

DESCRIPTION OF A PREFERRED EMBODIMENT

Figure 1:
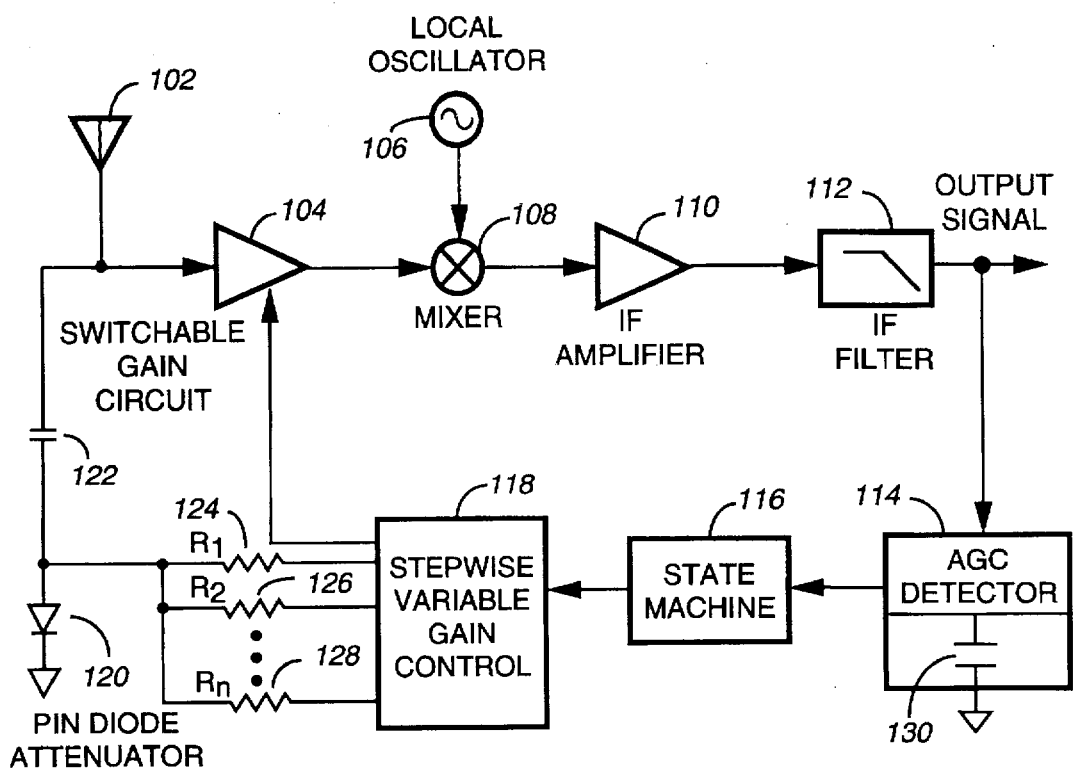
FIG. 1 is an electrical block diagram of a receiver having stepwise variable gain in accordance with a preferred embodiment of the present invention.

Referring to FIG. 1, an electrical block diagram of a receiver having a stepwise gain control is shown in accordance with a preferred embodiment of the present invention. The receiver circuit 100 comprises an antenna 102 for receiving a radio frequency (RF) signal, for example a 930 MHz signal, and a switchable gain circuit preferably including an RF amplifier 104. The switchable gain circuit, in an alternative embodiment, includes an attenuator comprising a pin diode attenuator 120 controlled by a bank of resistors 124–128 coupled to the RF amplifier 104 via a capacitor 122. The switchable gain circuit 104 amplifies the RF signal and a mixer 108 coupled to a local oscillator 106 produces an intermediate frequency (IF) signal (low frequency signal) which, according to the preferred embodiment, is a base band signal or Zero-IF signal. An IF amplifier 110 is coupled to the mixer 108 for amplifying the IF signal and an IF filter 112 filters the amplified IF signal to generate an output signal. The output signal is coupled to an automatic gain control (AGC) detector 114 which generates an AGC signal indicative of the average level of the output signal. The AGC detector 114 further comprises, for example, a capacitor 130 forming a part of a timing circuit that integrates the output signal (a low frequency signal) to generate an AGC detector signal as an integral signal. This integral signal (AGC detector signal) is coupled to a state machine 116. The state machine 116 detects when an integral (or average) of the output signal is outside first and second threshold values and generates a signal indicating that the integral of the output signal is lower than a second threshold value or that the integral of the output signal is higher than a first threshold value. The state machine 116 also generates (or does not generate) a signal when the integral of the output signal is within the range of the first and second threshold values indicating that the gain of the RF amplifier 104 should not be changed. The state machine 116 is coupled to the AGC detector 114 and generates a control signal for controlling a stepwise variable gain control circuit 118. The stepwise variable gain control circuit 118 generates a signal to control the gain of the RF amplifier 104 in response to the output of the state machine 116, e.g., increasing the gain of the RF amplifier 104 when the integral of the output signal is lower than the second threshold and decreasing the gain of the RF amplifier 104 when the integral of the output signal is higher than the first threshold. The stepwise variable gain control 118 preferably does not generate a signal when the integral of the output signal is within the range of the first and second thresholds indicating that the gain of the RF amplifier 104 should not be changed. The stepwise variable gain control circuit 118 also controls a PIN diode attenuator 120 via a bank of resistors 124–128 to increase or decrease the input signal level RF amplifier 104 in discrete seepwise steps. The PIN diode attenuator 120 is coupled to RF amplifier 104 by a capacitor 122. The attenuation of the PIN diode attenuator 120 is controlled, for example, by a suitable voltage source output of the stepwise variable gain control circuit 118 coupled to the PIN diode attenuator 120 via the bank of resistors ($R_1$, $R_2$, $R_n$) 124, 126 and 128.

Figure 2:
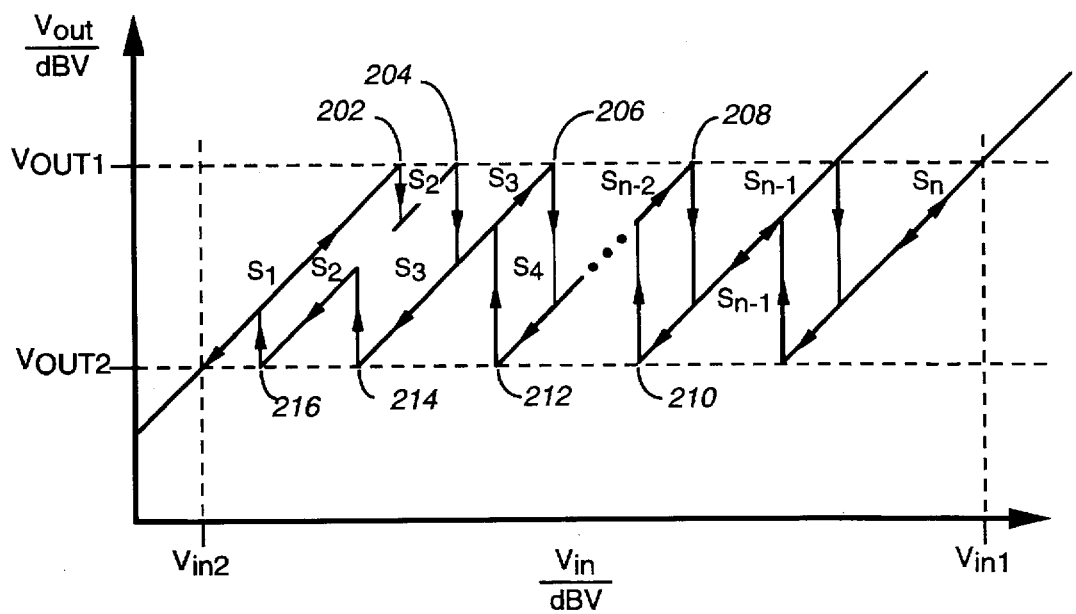
FIG. 2 is transfer function of the receiver according to FIG. 1.

Referring to FIG. 2, a transfer function of the stepwise switched AGC receiving circuit is shown according to FIG. 1. The horizontal axis represents the input signal levels ($V_{in}$) at the antenna 102. The vertical axis represents the level of the integral of the output signal ($V_{out}$). The integral of the output voltage, $V_{out1}$, is the first threshold value and $V_{out2}$ is the second threshold value, where the integrals of the output voltages $V_{out1}$ and $V_{out2}$ define the acceptable range of the output signal. The input voltages $V_{in1}$ and $V_{in2}$ define the range of input signals corresponding to an acceptable range of the output signals $V_{out1}$ and $V_{out2}$ respectively.

For example, when the input signal rises from a level below $V_{in2}$, the state machine 116 remains in state S1 corresponding to the maximum gain of the RF amplifier 104 and minimum PIN diode attenuator 120 attenuation until the integral of the level of the output signal reaches $V_{out1}$. When the integral of the level of the output signal reaches $V_{out1}$ 202 as indicated by the output of the AGC detector 114 the state machine 116 changes state to state S2 corresponding to a first stepwise gain reduction at the RF amplifier 104 (or a first stepwise attenuation increase at the PIN diode attenuator 120) via the stepwise variable gain control 118. As input voltage $V_{in}$ increases, the integral of the output signal again reaches $V_{out1}$ 204, the state machine 116 changes state to state S3 corresponding to a second stepwise gain reduction at the RF amplifier 104 (or a second stepwise attenuation increase at the PIN diode attenuator 120) via the stepwise variable gain control 118. As the signal continues to rise, the process described above repeats until the state machine 116 reaches its maximum or final state $S_n$ beyond which no further increase in the attenuation of the input signal is or can be provided.

Alternatively, when the input signal falls from a level above $V_{in1}$, the state machine 116 remains in state $S_n$ corresponding to the maximum attenuation of the RF amplifier and maximum PIN diode attenuator 120 attenuation until the integral of the level of the output signal reaches $V_{out2}$. When the integral of the level of the output signal reaches $V_{out2}$ 210, the state machine 116 changes state to state $S_{n-1}$ corresponding to a first stepwise attenuation reduction at the RF amplifier 104 (or a first stepwise attenuation decrease at the PIN diode attenuator 120) via the stepwise variable gain control 118. As the input voltage $V_{in}$ decreases, the integral of the output signal again reaches $V_{out2}$ 212, the state machine 116 changes state to state $S_{n-2}$ corresponding to a second stepwise attenuation reduction at the RF amplifier 104 (or a second stepwise attenuation decrease at the PIN diode attenuator 120) via the stepwise variable gain control 118. As the signal continues to decreases, the process described above repeats until the state machine 116 reaches its first or maximum gain state beyond which no further increase in gain of the input signal is or can be provided.

In this way, the AGC control is not continuous, but instead is in discrete steps. When the signal level detected by the AGC detector exceeds or falls below the reference signal levels, the state machine sends a signal to the stepwise variable gain control to either decrease or increase the gain of the RF amplifier. These signals sent from the state machine have hysteresis (the switch threshold is different for rising and falling signals). The output of the stepwise variable control controls both the RF amplifier gain and the external PIN diode attenuator in discrete steps.

For best performance, it was found that the gain reduction of the first AGC level should be less than that of the other later levels. When the states of the state machine are changed, the resulting transients in the signal path are proportional to the change in attenuation. For low signal levels, these transients can exceed the received signal level, resulting in missed messages. In addition, the transients could be large enough to "fool" the state machine into switching incorrectly, leading to possible instability. By using smaller attenuation steps for the first AGC detector levels these problems were minimized. The use of hysteresis in the state machine, of course, also improves stability by providing a margin of safety for transient effects without causing a change of state.

If the AGC detector 114 was not designed to come out of warm-up in any particular state, and an interfering adjacent channel signals were present with the desired signal, the interfering signal would compress active filters in the signal path such that the AGC detector could not detect the strong desired signal, resulting in missed messages. This problem was overcome by increasing the dynamic range of the signal path and by modifying the state machine so that it was forced to come out of warm-up in state $S_3$, a high-attenuation state. While this lengthened total warm-up time (by the time needed to switch down to high-gain state when low level signals are present), an improved adjacent channel selectivity is achieved at higher desired signal levels. Clamping the AGC to a predictable state coming out of the warm-up period also improved AGC performance by eliminating warm-up transient effects during the first received bits.

In this way, with stepwise gain, the RF amplifier is switched in steps for large changes in signal levels. For small changes in the signal levels, the hysteresis prevents any change in the RF amplifier gain. Therefore, large changes in the gain of the RF amplifier are prevented because stepwise switching of the RF amplifier gain greatly reduces the chance of the AGC loop oscillation or instability, for example, when a strong RF signal disappears from the input of the receiver. The disappearance of an RF signal from the input causes transients at the mixers when, in actuality, there is no signal at the input, only the transients caused by the sudden disappearance of the RF signal. The attempt by the AGC to adjust to the transient signals causes the AGC loop to become unstable.

Accordingly, the receiver achieves both fast warm-up time and good stability. The AGC warm-up time improved to approximately 3.5 ms, including the time needed to "count down" from the initial AGC state to threshold sensitivity. Since the AGC control signal is quantized or stepwise there is no low-frequency AC ripple to filter out, and the use of hysteresis in the state machine and shaped attenuation steps minimize the effects of self-reception.

Figure 3:
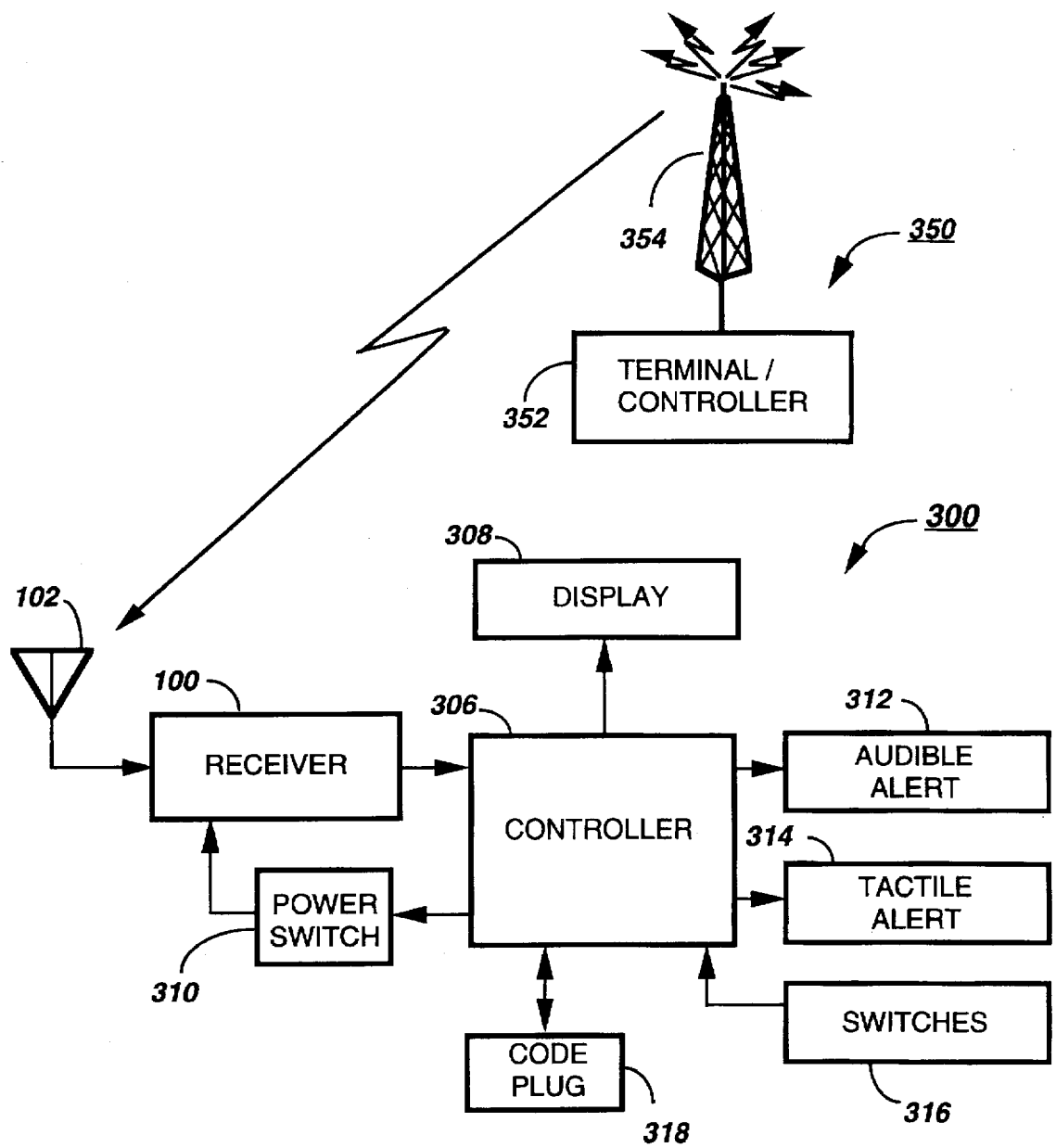
FIG. 3 is an electrical block diagram of a selective call receiver comprising the receiver having stepwise variable gain according to FIG. 1.

Referring to FIG. 3, an electrical block diagram of a selective call receiver is shown. A selective call network 350 forms a part of the selective call system comprising a selective call terminal controller 352 which receives messages from an input device, for example a telephone, computer or an alpha-entry device or the like (not shown). The received message or information is processed by encoding the message destined for a selective call receiver with an address. The encoded message is then passed to an antenna 354 which transmits and receives radio frequency (RF) information to and from a communication device, for example the selective call receiver 300.

The selective call receiver 300 comprises an antenna 102 that provides an RF signal to the receiver 100 which receives the RF signal as described in reference to FIG. 1. The receiver 100 generates a recovered signal suitable for processing by a controller/decoder 306 in a manner well known to one of ordinary skill in the art. A power switch 310 coupled to a battery (not shown) and the controller/decoder 306 performs battery saving functions well known to one of ordinary skill in the art. The controller/decoder 306 also performs function such as encoding and decoding messages and controlling the operation of the selective call receiver 300 well known to one of ordinary skill in the art. The controller/decoder 306 processes the received signal to decode the address and compares the decoded address with one or more predetermined addresses contained in a memory, for example, a codeplug 318. When the addresses are substantially similar, the user is alerted that a signal has been received either by an audio alert (e.g., a speaker or transducer) 312 or a tactile alert (e.g., a vibrator) 314. The received signal may also include optional message data directed to some selective call receivers. Also, if the selective call receiver 300 includes an optional voice output, recovered audio components of the received RF signal may be presented. For a message selective call receiver; the recovered message is stored in the memory 318 for subsequent presentation by an output device which for example is a display 308. The output device will automatically, or when manually selected by switches 316, present the message, such as by displaying the message on the display 308.

In summary, a selective call receiver 300 comprises a receiver 100 for receiving a radio frequency (RF) signal, an RF amplifier having a stepwise gain control for varying a gain of the RF signal in at least two discrete steps, a mixer circuit, coupled to the receiver, for mixing the RF signal to an output signal and an automatic gain control (AGC) detector with a hysteresis response to the output signal for producing or generating a response (AGC detector signal) indicative of an integral of the output signal. The AGC detector comprises a timing circuit integrating the output signal to first and second threshold values and a state machine having a switchable signal coupled to the stepwise gain control of the RF amplifier to discretely vary a bias signal to the RF amplifier by generating a stepwise variation of the gain of the RF amplifier. The state machine, in response to the AGC detector, increases the gain of the RF amplifier when the integral of the output signal is lower the second threshold value and decreases the gain of the RF amplifier when the integral of the output signal is higher than the first threshold value.

What is claimed is:

1. A receiver for receiving an input signal and generating an output signal therefrom, comprising:
   a switchable gain circuit having a stepwise variable gain control;
   an automatic gain control (AGC) detector for detecting a level of the output signal and generating an AGC detector signal indicative of the level of the output signal; and
   a state machine, coupled to the AGC detector, and being responsive to the AGC detector signal, generating a signal to control the stepwise variable gain control to increase or decrease a gain of the switchable gain circuit in discrete stepwise steps wherein the AGC detector further comprises a timing circuit for integrating the output signal and the state machine detects when an integral of the output signal is outside first and second threshold values.

2. The selective call receiver according to claim 1 wherein:
   the AGC detector generates an integral of the output signal; and
   the state machine, in response to the AGC detector, increases the gain of the switchable gain circuit when the integral of the output signal is lower than the second threshold value and decreases the gain of the switchable gain circuit when the integral of the output signal is higher than the first threshold value.

3. The selective call receiver according to claim 2 wherein the state machine does not vary the gain of the switchable gain circuit when the AGC detector detects the integral of the output signal within the first and second threshold values.

4. The selective call receiver according to claim 1 wherein the receiver generates the output signal at baseband.

5. The selective call receiver according to claim 1 wherein the switchable gain circuit comprises a radio frequency amplifier.

6. The selective call receiver according to claim 1 wherein the switchable gain circuit comprises an attenuator.

7. A selective call receiver, comprising:
   a receiver for receiving a radio frequency (RF) signal;
   an RF amplifier having a stepwise gain control for varying a gain of the RF signal in at least two discrete steps;
   an automatic gain control (AGC) detector with a response to a low frequency signal being generated to produce a response indicative of an integral of the low frequency signal; and
   a state machine coupled to the stepwise gain control of the RF amplifier for discretely varying a bias signal to the RF amplifier, having a switchable signal source, generating a stepwise variation of the gain of the RF amplifier.

8. The selective call receiver according to claim 7 wherein the AGC detector further comprises a timing circuit for integrating the low frequency signal and the state machine detects when an integral of the low frequency signal is outside first and second threshold values.

9. The selective call receiver according to claim 8 wherein:
   the AGC detector generates an integral of the low frequency signal; and
   the stepwise gain control, in response to the AGC detector, increases the gain of the RF amplifier when the integral of the low frequency signal is lower than the second threshold value and decreases the gain of the RF amplifier when the integral of the low frequency signal is higher than the first threshold value.

10. A selective call receiver, comprising:
    a receiver for receiving a radio frequency (RF) signal;
    an RF amplifier having a stepwise gain control for varying a gain of the RF signal in at least two discrete steps;
    an automatic gain control (AGC) detector with a response to an output signal being generated to produce a response indicative of an integral of the output signal, the AGC detector comprises a timing circuit for integrating the output signal, and
    a state machine having a switchable signal coupled to the stepwise gain control of the RF amplifier for discrete amplifier by generating to the RF amplifier by generating a stepwise variation of the gain of the RF amplifier, the state machine detects when an integral of the output signal is outside first and second threshold values and, in response to the AGC detector, increases the gain of the RF amplifier when the integral of the output signal is lower than the second threshold value and decreases the gain of the RF amplifier when the integral of the output signal is higher than the first threshold value.

* * * * *

UNITED STATES PATENT AND TRADEMARK OFFICE
CERTIFICATE OF CORRECTION

PATENT NO : 5,734,974
DATED : March 31, 1998
INVENTOR(S): Callaway et al.

It is certified that error appears in the above-identified patent and that said Letters Patent is hereby corrected as shown below:

In column 6, lines 50-51, delete "discrete amplifier by generating", and replace with --discretely varying a bias signal--.

Signed and Sealed this

Seventh Day of December, 1999

Attest:

Q. TODD DICKINSON

*Attesting Officer*    *Acting Commissioner of Patents and Trademarks*